(12) United States Patent
Son et al.

(10) Patent No.: US 8,035,104 B2
(45) Date of Patent: Oct. 11, 2011

(54) THIN FILM TRANSISTOR DISPLAY PANEL AND MANUFACTURING METHOD THEREOF

(75) Inventors: Ji-Hyeon Son, Seongnam-si (KR);
Jang-il Kim, Asan-si (KR);
Seung-Hyun Hur, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 222 days.

(21) Appl. No.: 12/480,121

(22) Filed: Jun. 8, 2009

(65) Prior Publication Data

US 2010/0148176 A1 Jun. 17, 2010

(30) Foreign Application Priority Data

Dec. 15, 2008 (KR) ........................ 10-2008-0127359

(51) Int. Cl.
*H01L 29/04* (2006.01)
(52) U.S. Cl. .................. 257/59; 257/72; 349/43
(58) Field of Classification Search .................. 257/59, 257/72; 349/43
See application file for complete search history.

(56) References Cited

U.S. PATENT DOCUMENTS

| | | | |
|---|---|---|---|
| 2004/0195573 A1* | 10/2004 | Kim | ................................ 257/72 |
| 2004/0239838 A1 | 12/2004 | Lai | |
| 2005/0243235 A1 | 11/2005 | Lee | |
| 2006/0081849 A1* | 4/2006 | Lee et al. | ........................ 257/72 |
| 2007/0164286 A1* | 7/2007 | Kim | ................................ 257/59 |
| 2008/0068537 A1 | 3/2008 | Lee | |

FOREIGN PATENT DOCUMENTS

| | | |
|---|---|---|
| JP | 08015727 | 1/1996 |
| JP | 10073809 | 3/1998 |
| JP | 2000098368 | 4/2000 |
| JP | 2000267132 | 9/2000 |
| JP | 2008066358 | 3/2008 |
| KR | 1020060011585 | 2/2006 |
| KR | 1020060025631 | 3/2006 |
| KR | 100725425 | 5/2007 |
| KR | 1020070075159 | 7/2007 |
| KR | 1020080029337 | 4/2008 |

* cited by examiner

*Primary Examiner* — Kenneth Parker
*Assistant Examiner* — Anthony Ho
(74) *Attorney, Agent, or Firm* — H.C. Park & Associates, PLC (57) ABSTRACT

The present invention relates to a thin film transistor array panel that includes an organic layer formed on a data line and a drain electrode disposed on a color filter. A thickness of a portion of the organic layer around a contact hole exposing a portion of the drain electrode is similar to a thickness of a portion of the organic layer around a contact hole exposing a portion of the data line. Having approximately the same thickness can prevent non-uniform etching of the organic layer around contact holes and deterioration of the thin film transistor array panel.

15 Claims, 7 Drawing Sheets

THIN FILM TRANSISTOR DISPLAY PANEL AND MANUFACTURING METHOD THEREOF

CROSS REFERENCE TO RELATED APPLICATION

This application claims priority from and the benefit of Korean Patent Application No. 10-2008-0127359 filed on Dec. 15, 2008, which is hereby incorporated by reference for all purposes as if fully set forth herein.

BACKGROUND OF THE INVENTION

1. Field of the Invention

Embodiments of the present invention relate to a thin film transistor (TFT) array panel and a manufacturing method thereof.

2. Discussion of the Background

Liquid crystal displays (LCDs) are one of the most widely used flat panel displays. A liquid crystal display has two display panels on which field generating electrodes such as pixel electrodes and common electrodes are formed. A liquid crystal layer may be interposed between the two panels. In the liquid crystal display, voltages may be applied to the field generating electrodes to generate an electric field over the liquid crystal layer. An alignment of liquid crystal molecules of the liquid crystal layer may be determined by the electric field. Accordingly, polarization of incident light may be controlled.

The liquid crystal display further includes TFTs connected to pixel electrodes, a plurality of signals lines connected to the TFTs, and a color filter to realize a desired color. The color filter may be made of an organic material including pigments, and may be arranged in one of the display panels including the TFTs. For planarization of the TFT array panel, an organic layer may be coated on surface of the TFT array panel. Next, the organic layer may be etched to form a contact hole exposing the electrode of the thin film transistor or a contact hole of a pad portion. However, the coated organic layer may have significantly different thicknesses at different portions of the TFT array panel leading to problems when etching the organic layer.

SUMMARY OF THE INVENTION

Exemplary embodiments of the present invention relate to a thin film transistor (TFT) array panel and a manufacturing method thereof.

Additional features of the invention will be set forth in the description which follows, and in part will be apparent from the description, or may be learned by practice of the invention.

Exemplary embodiments of the present invention disclose a thin film transistor array panel comprising a substrate and a gate line disposed on the substrate. The gate line comprises a gate electrode. The thin film transistor array panel further comprises a gate insulating layer disposed on the gate line; a semiconductor formed on the gate insulating layer; a color filter disposed on the semiconductor; and a data line disposed on the semiconductor. The data line comprises a source electrode. The thin film transistor array panel further comprises a drain electrode comprising a first part and a second part. The first part of the drain electrode is disposed on and overlaps the color filter. The second part of the drain electrode faces the source electrode.

Exemplary embodiments of the present invention disclose a method for manufacturing a thin film transistor array panel. The method comprises the steps of: forming a gate line comprising a gate electrode on a substrate; forming a gate insulating layer on the gate line; forming a semiconductor on the gate insulating layer; forming a color filter on the semiconductor; and forming a data line and a drain electrode on the color filter. The data line comprises a source electrode. The drain electrode comprises a first part of the drain electrode and a second part of the drain electrode. The first part of the drain electrode overlaps the color filter and the second part of the drain electrode faces the source electrode.

It is to be understood that both the foregoing general description and the following detailed description are exemplary and explanatory and are intended to provide further explanation of the invention as claimed.

DETAILED DESCRIPTION OF THE ILLUSTRATED EMBODIMENTS

The present invention will be described more fully hereinafter with reference to the accompanying drawings, in which exemplary embodiments of the invention are shown. The described embodiments may be modified in various different ways and may be embodied in many different forms without departing from the spirit or scope of the present invention. Rather, these exemplary embodiments are provided so that this disclosure is thorough, and will fully convey the scope of the invention to those skilled in the art. In the drawings, the sizes and relative sizes of layers and regions may be exaggerated for clarity and irrelevant portions may be omitted to clearly describe the present invention. Like reference numerals designate like elements throughout the specification. Detailed descriptions of well-known functions and structures incorporated herein may be omitted to avoid obscuring the subject matter of the embodiments.

It will be understood that when a first element or layer is referred to as being "on," "connected to" or "coupled to" another element(s) or layer(s), the first element or layer can be directly on, connected to, or coupled to the other element or layer(s) and/or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that although the terms first, second, third etc. may be used herein to describe various elements, components, regions, layers and/or sections, these elements, components, regions, layers and/or sections should not be limited by these terms. These terms are used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments and is not intended to be limiting of the present invention. As used herein, the singular forms "a," "an" and "the" can include the plural forms as well, unless the context clearly indicates otherwise. It will be further understood that the terms "comprises" and/or "comprising," when used in this specification, can specify the presence of stated features, integers, steps, operations, elements, and/or components, but do not necessarily preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result of, for example, manufacturing techniques and/or tolerances, are to be expected. Thus, example embodiments of the present invention should not be construed as limited to the particular shapes of regions illustrated herein but can include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in detail with reference to the accompanying drawings.

A TFT array panel according to an exemplary embodiment of the present invention will be described with reference to FIG. 1 and FIG. 2.

Figure 1:
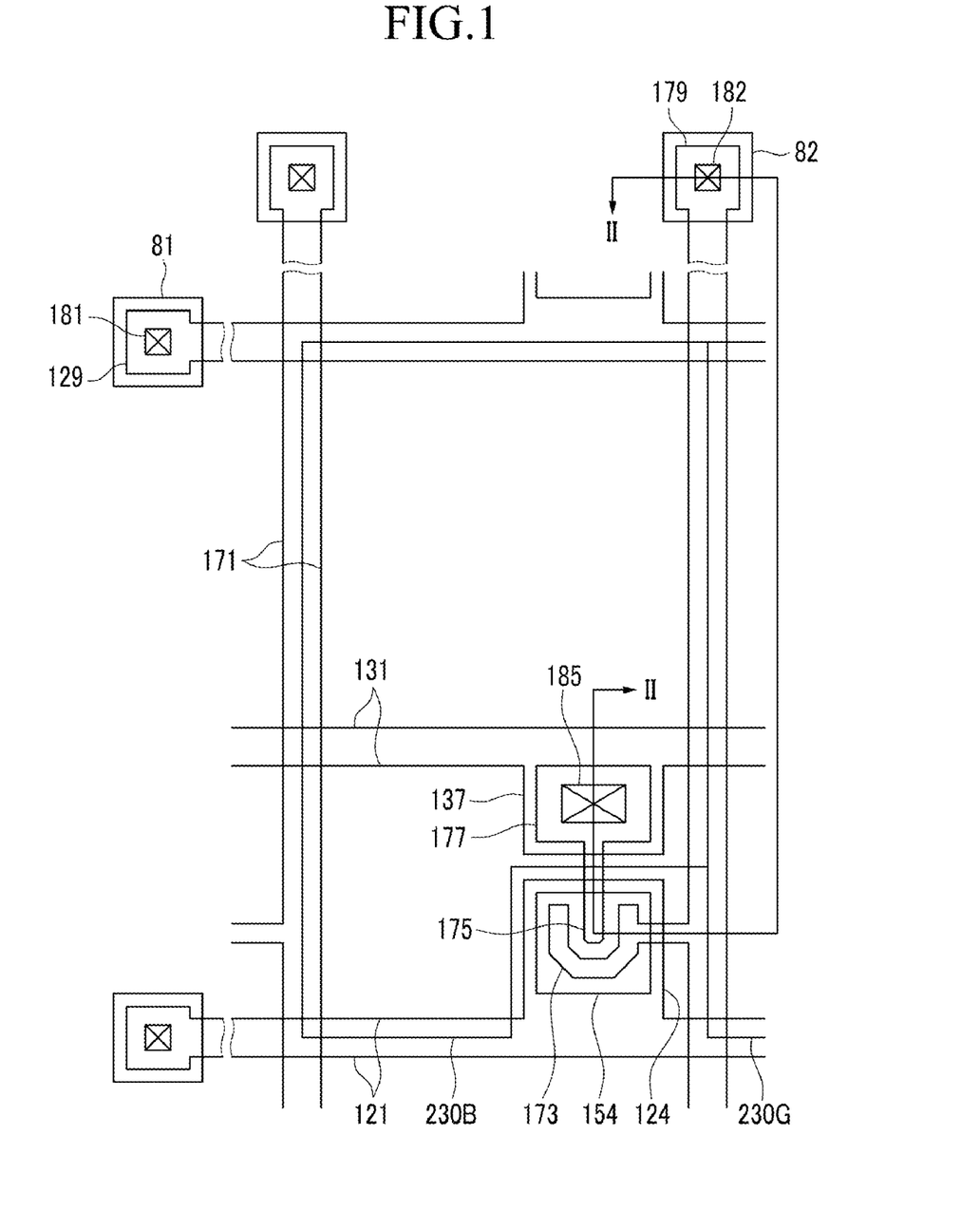
FIG. 1 is a layout view of a thin film transistor array panel according to an exemplary embodiment of the present invention.
Figure 2:
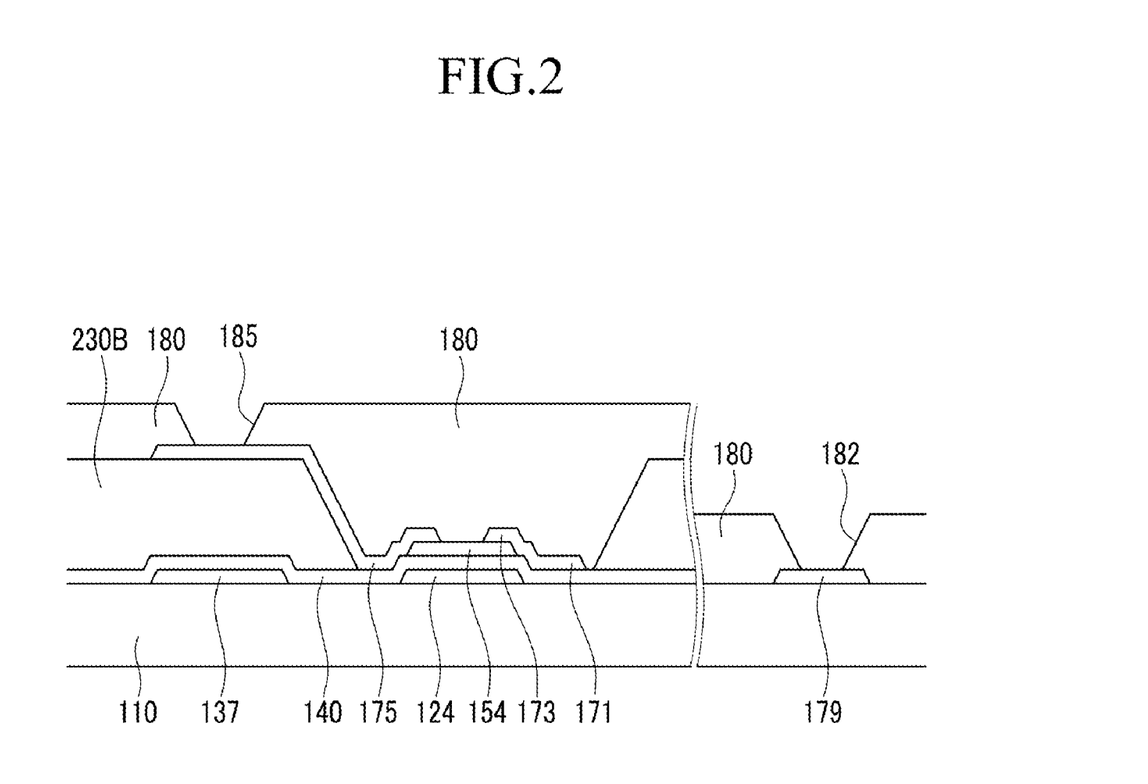
FIG. 2 is a cross-sectional view taken along the line II-II of the thin film transistor array panel shown in FIG. 1.

FIG. 1 is a layout view of a TFT array panel, and FIG. 2 is a cross-sectional view of the TFT array panel shown in FIG. 1 taken along the line II-II.

A gate line (121 and 129), a gate electrode 124, a storage electrode line 131, and a storage electrode 137 may be formed on an insulating substrate 110 made of glass or plastic. Each gate line 121 can transmit a gate signal and can extend in an approximate row (i.e., horizontal) direction. Each gate line 121 can include a plurality of gate electrodes 124 protruding upward and an optional end portion 129.

Storage electrode line 131 can extend substantially parallel to the gate line 121 and can be applied with a predetermined voltage. The storage electrode line 131 can include the storage electrode 137, which may have a quadrangular shape. It should be understood that various shapes and arrangements of the storage electrode line 131 may be used. Further, in some cases, the storage electrode line 131 and the storage electrode 137 may be omitted.

A gate insulating layer 140 may be formed on the gate line 121 and the storage electrode line 131. The gate insulating layer 140 may include silicon nitride (SiNx) or silicon oxide (SiOx). Other suitable materials may be used in the gate insulating layer 140.

A semiconductor island 154 made of hydrogenated amorphous silicon (simply referred to as a-Si) or crystallized silicon may be formed on the gate insulating layer 140. The semiconductor island 154 may be disposed on the gate electrode 124.

The color filter 230 may include a blue color filter 230B, a green color filter 230G and a red color filter (not shown) that may be formed on the gate insulating layer 140. The blue color filter 230B may cover the storage electrode line 131 and the storage electrode 137. In some cases, the blue color filter 230B may not cover the semiconductor 154. The blue color filter 230B may be disposed in one pixel area defined by two gate lines 121 and two data lines 171. Also, the blue color filter 230B may be extended in an approximate column (i.e., vertical) direction thereby being disposed in several pixel areas. In this case, the blue color filter 230B may have a stripe shape. The blue color filter 230B may be made of a photosensitive organic material and may include blue pigments. The description of the above-described blue color filter 230B may be similarly applied to the green color filter 230G and the red color filter (not shown).

A data line (171 and 179) and a drain electrode 175 may be formed on the color filters 230B and 230G and the semiconductor 154. The data line 171 may transmit a data voltage and may extend in an approximate column (i.e., vertical) direction, thereby crossing the gate line 121. The data line 171 may include end portion 179 of the data line 171, and a source electrode 173 curved in a "U" shape on the gate electrode 124, as can be seen in FIG. 1.

The drain electrode 175 may be separated from the data line 171 and may include a narrow portion and a wide portion 177. The narrow portion may include an end portion enclosed by the source electrode 173, and the wide portion 177 may be almost quadrangular in shape and may overlap the storage electrode 137. In some cases, the wide portion 177 of the drain electrode 175 may have almost a same area as the storage electrode 137. However, the wide portion 177 should not exceed the boundaries of the storage electrode 137.

The gate electrode 124, the source electrode 173, the drain electrode 175, and semiconductor 154 may form a TFT structure. The channel of the TFT may be formed in the semiconductor 154 between the source electrode 173 and the drain electrode 175. The drain electrode 175 may be connected to a pixel electrode (not shown) of the liquid crystal display (LCD) and may apply a driving voltage to the pixel electrode.

An organic layer 180 may be formed on the data line (171 and 179) and the drain electrode 175. The organic layer 180 may be made of a photosensitive organic material and may function as a planarizer for underlying layers. The organic layer 180 may be deposited across the substrate 110 and may have a thickness of approximately 2-3 μm. In general, the organic layer 180 may have any suitable thickness. The organic layer 180 may be patterned by an etch process to form openings 185, 182, and 181 that may expose portions of the drain electrode 175, and the end portions 129 and 179 of the gate line 121 and the data line 171. In some cases, at least one of the end portions 129 and 179 of the gate line 121 and the data line 171 may be omitted. The drain electrode 175 may be disposed on each of the color filters 230B and 230G such that a thickness of the organic layer 180 near the drain electrode 175 may be approximately 2-3 μm and may be similar to the thickness of the organic layer 180 near the end portions 129 and 179 of the gate line 121 and the data line 171. In some cases, a difference between the thickness of the organic layer 180 near the drain electrode 175 and the thickness of the organic layer 180 near the end portions 129 and 179 may be approximately 1 μm or less. That is, when forming the openings 185, 182, and 181 through the etch process, the thickness of the organic layer 180 around the openings 185, 182, and 181 can be approximately the same so that the organic layer 180 may be uniformly etched, thereby preventing deterioration of the TFT array panel.

In contrast, in a conventional TFT array panel, when the drain electrode is disposed under the color filter, the color filter may have an opening exposing the drain electrode such that if an organic layer having a thickness of about 2-3 μm is coated on the color filter, a portion of the organic layer overlapping the drain electrode may have a thickness of about 5-6 μm. Accordingly, when etching the organic layer with reference to the thickness of about 5-6 μm, over-etching occurs such that the planarization function may not be executed, and the end portions of the gate line and the data line may be damaged. Furthermore, when etching the organic layer having a thickness of about 5-6 μm, the organic layer overlapping the drain electrode may not be sufficiently etched resulting in the drain electrode being unexposed.

Next, a manufacturing method of the TFT array panel shown in FIG. 1 and FIG. 2 will be described.

The gate line (121 and 129), the gate electrode 124, the storage electrode line 131, and the storage electrode 137 may be formed on the substrate 110.

Next, the gate insulating layer 140 may be disposed on the gate line 121 and the storage electrode line 131. The semiconductor island 154 may then be formed on the gate insulating layer 140.

The color filters 230B and 230G may be deposited on the gate insulating layer 140 and the semiconductor 154 and patterned to form an opening exposing the semiconductor 154. When the color filters 230B and 230G include photosensitive organic material, in some cases, the opening may be formed through the exposure and developing processes without a photolithography process. In other cases, a photolithography process may be used.

Next, the data line (171 and 179) and the drain electrode 175 may be formed on the color filters 230B and 230G.

Organic layer 180 may then be formed on the drain electrode 175, the data line (171 and 179), and the color filters 230B and 230G. The contact holes 185 and 182 of the organic layer 180 may be formed through a photolithography process. When the organic layer 180 includes photosensitive organic material, the contact holes 185 and 182 may be formed through exposure and developing processes. The method for forming the TFT and the electrode may generally be thin film deposition and patterning by photolithography.

Next, a TFT array panel according to another exemplary embodiment of the present invention will be described with reference to FIG. 3, FIG. 4, and FIG. 5.

Figure 3:
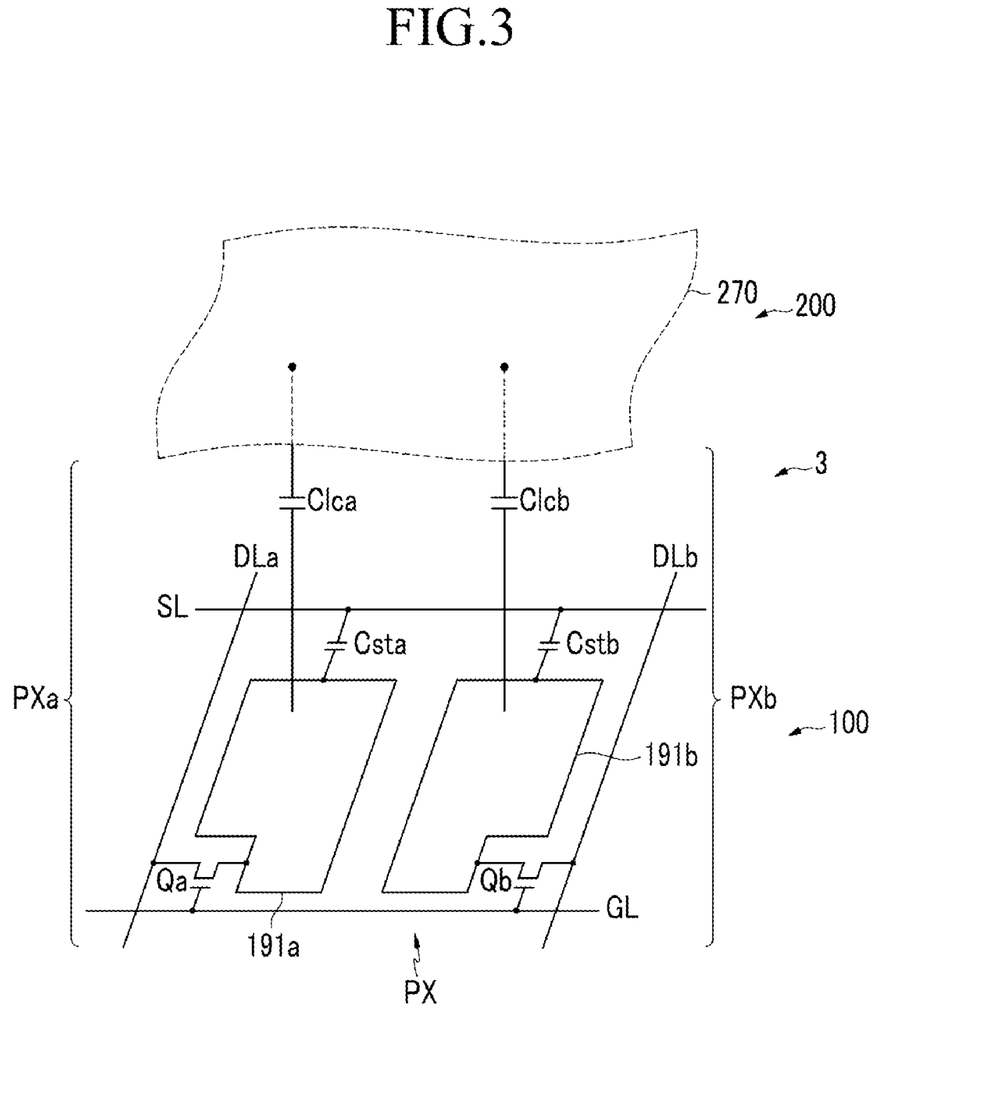
FIG. 3 is an equivalent circuit diagram of one pixel in a liquid crystal display including a thin film transistor array panel according to an exemplary embodiment of the present invention.

FIG. 3 is an equivalent circuit diagram of a pixel in a LCD including a TFT array panel.

Referring to FIG. 3, a LCD according to the present exemplary embodiment may include a TFT array (lower) panel 100, a counter (upper) panel 200, and a liquid crystal layer 3 interposed between the TFT array panel 100 and the counter panel 200. The TFT array panel 100 may include signal lines including a plurality of gate lines GL, a plurality of pairs of data lines DLa and DLb, a plurality of storage electrode lines SL, and a plurality of pixels PX connected to the signal lines.

Each pixel PX may include a pair of subpixels PXa and PXb. Subpixel PXa may be connected to a switching element Qa, a liquid crystal capacitor Clca, and a storage capacitor Csta. Subpixel PXb may be connected to a switching element Qb, a liquid crystal capacitor Clcb, and a storage capacitor Cstb.

Each switching element Qa/Qb may be a three-terminal element such as a TFT provided on the lower panel 100, and may include a control terminal connected to the gate line GL, an input terminal connected to the data line DLa/DLb, and an output terminal connected to the liquid crystal capacitor Clca/Clcb and the storage capacitor Csta/Cstb.

Subpixel electrodes 191a/191b and a common electrode 270 form two electrodes of the liquid crystal capacitors Clca/Clcb. Liquid crystal layer 3 may be arranged between the electrodes 191a/191b and 270 and may be a dielectric material.

The storage capacitor Csta/Cstb may be connected to the liquid crystal capacitor Clca/Clcb. The storage capacitor Csta/Cstb may be formed due to an overlap of the storage electrode line SL provided on the panel 100 and a subpixel electrode 191a/191b. An insulator may be interposed between the storage electrode line SL and the subpixel electrode 191a/191b. A predetermined voltage, such as the common voltage Vcom, may be applied to the storage electrode line SL.

Figure 4:
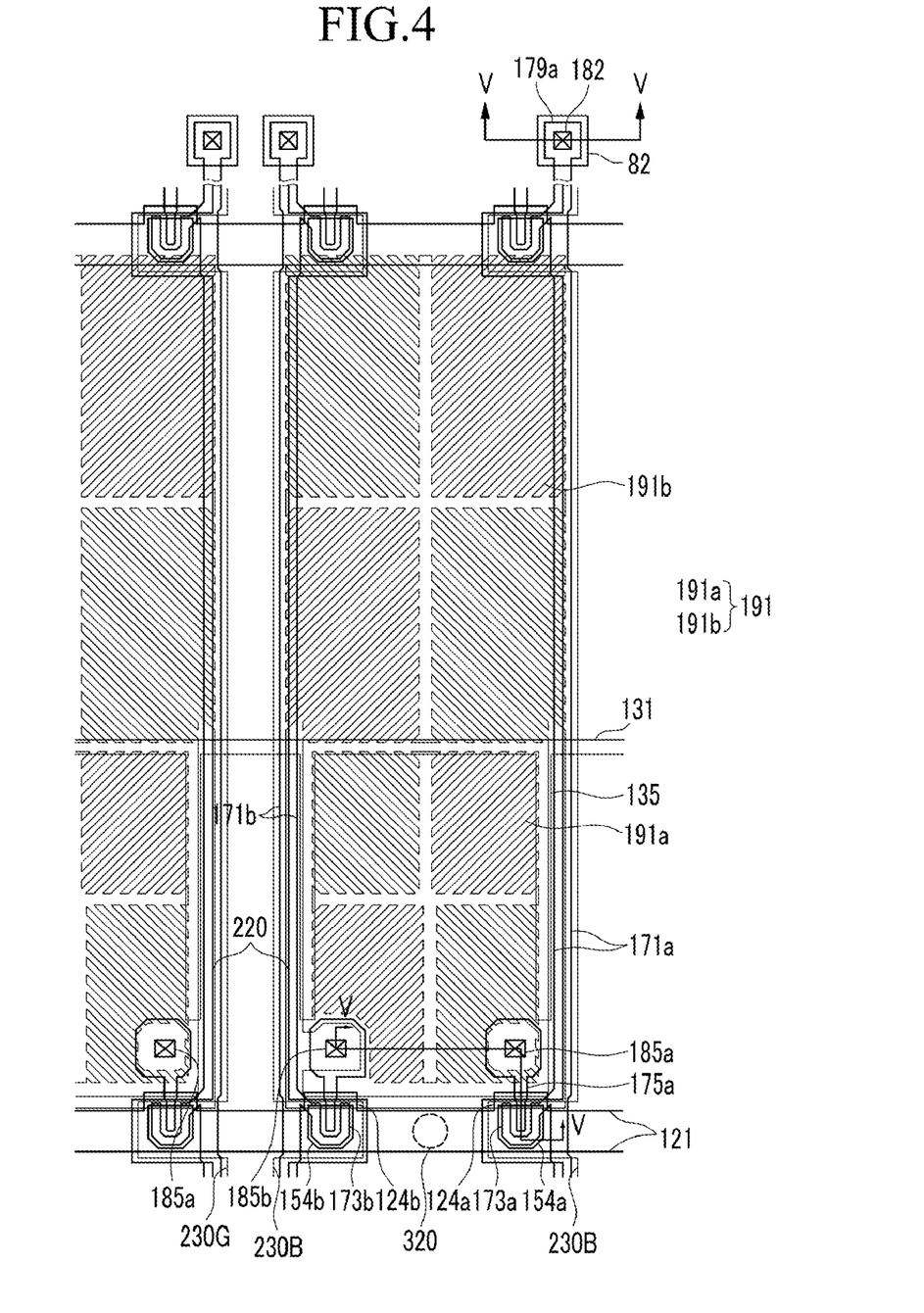
FIG. 4 is a layout view of a thin film transistor array panel according to an exemplary embodiment of the present invention.
Figure 5:
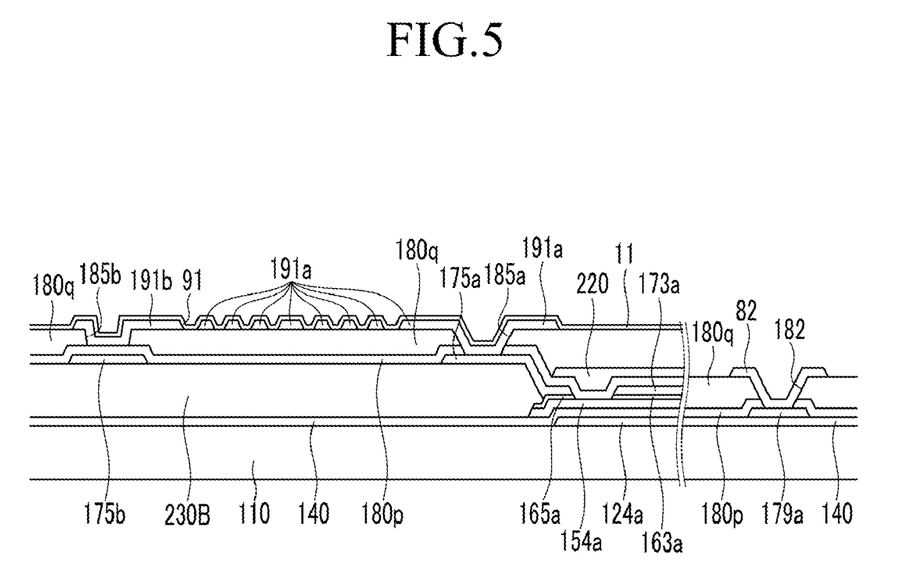
FIG. 5 is a cross-sectional view taken along the lines V-V of the thin film transistor array panel shown in FIG. 4.

FIG. 4 is a layout view of a TFT array panel according to an exemplary embodiment of the present invention, and FIG. 5 is a cross-sectional view of the TFT array panel shown in FIG. 4 taken along the line V-V.

Referring to FIG. 4 and FIG. 5, a plurality of gate lines 121 and a plurality of storage electrode lines 131 and 135 are shown. Each gate line 121 may include a plurality of first and second gate electrodes 124a and 124b protruding upward.

The storage electrode lines may include a stem 131 extending substantially parallel to the gate lines 121, and a plurality of storage electrodes 135 extending from the stem 131.

A gate insulating layer 140 may be formed on the gate lines 121 and the storage electrode lines 131 and 135. A plurality of semiconductors 154a and 154b, which may be made of amorphous or crystallized silicon, may be formed on the gate insulating layer 140.

A plurality of a pair of ohmic contacts 161a and 161b, 163a and 163b, and 165a and 165b may be formed on the semiconductors 154a and 154b. The ohmic contacts 161a, 161b, 163a, 163b, 165a, and 165b may be formed of a material such as a metal silicide or of n+ hydrogenated amorphous silicon in which an n-type impurity is doped with a high concentration.

Color filters 230B and 230G may be formed on the ohmic contacts 161a, 161b, 163b, 163b, 165a, and 165b, and the gate insulating layer 140. In some cases, the color filters 230B and 230G may not be formed on portions overlapping the gate electrodes 124a and 124b. Accordingly, most of the ohmic contacts 161a, 161b, 163a, 163b, 165a, and 165b may be covered; however, a portion of some of the ohmic contacts 161a, 161b, 163b, 163b, 165a, and 165b formed on the portions overlapping the gate electrodes 124a and 124b may be exposed.

A plurality of pairs of data lines 171a and 171b and a plurality of pairs of first and second drain electrodes 175a and 175b may be formed on the color filters 230B and 230G. A storage voltage supplying line (not shown) may be formed in a peripheral area along the data lines 171a and 171b. The storage voltage supplying line may be extended in a substantially column (i.e., vertical) direction and may be electrically connected to the plurality of storage electrode lines 131.

The data lines 171a and 171b may extend substantially in the column (i.e., vertical) direction, and may cross the gate lines 121 and the stems of the storage electrode lines 131. The data lines 171a/171b may respectively include a plurality of first/second source electrodes 173a/173b extending toward the first/second gate electrodes 124a/124b. The first/second source electrodes 173a/173b may be curved with a "U" shape and may be arranged opposite to the first/second drain electrodes 175a/175b with respect to the first/second gate electrodes 124a/124b.

A first/second gate electrode 124a/124b, a first/second source electrode 173a/173b, a first/second drain electrode 175a/175b, and a first/second semiconductor 154a/154b respectively may form a first/second thin TFT Qa/Qb.

To reduce contact resistance, the ohmic contacts 163b and 165b may be interposed between the underlying semiconductor islands 154a and 154b and the overlying data lines 171a and 171b and drain electrodes 175a and 175b.

A lower passivation layer 180p may be formed on the data lines 171a and 171b, the drain electrodes 175a and 175b, and the exposed portions of the semiconductors 154a and 154b. In some cases, the lower passivation layer 180p may be made of silicon nitride or silicon oxide. In general, any suitable material may be to form the lower passivation layer 180p.

A light blocking member 220 may be formed on the lower passivation layer 180p. The light blocking member 220 may extend substantially parallel to the data lines 171a and 171b in approximately the column (i.e., vertical) direction, and may include protrusions covering the first and second TFTs Qa and Qb. The light blocking member 220 may also cover a portion between the color filters 230B and 230G, thereby preventing light leakage.

An organic layer 180q may be formed on the lower passivation layer 180p and the light blocking member 220. The organic layer 180q may be formed and deposited in a manner similar to the formation and deposition of organic layer 180 in the TFT array panel described above with reference to FIG. 1 and FIG. 2. Accordingly, a thickness of the organic layer 180q around the contact holes 185a and 185b that expose a portion of the drain electrode 175a and 175b may be approximately 2-3 μm and may be similar to the thickness of the organic layer 180q around the contact hole 185 exposing a portion of the end portion 179a and 179b of the data line. A deterioration of the TFT array panel may be prevented through the uniform etch process of the organic layer 180.

A plurality of pixel electrodes 191 and connecting members 81 and 82 may be formed on the organic layer 180q. The pixel electrodes 191 and the connecting members 81 and 82 may be composed of Indium Tin Oxide (ITO) or Indium Zinc Oxide (IZO), and may be formed using the same process.

Referring to FIG. 4, each pixel electrode 191 may include a first subpixel electrode 191a separated from a second subpixel electrodes 191b by a gap.

The overall shape of the first and second subpixel electrodes 191a and 191b may be a quadrangle. It should be understood that various modifications and configurations are possible for the first/second subpixel electrodes 191a/191b. In some cases, an area occupied by the second subpixel electrode 191b may be larger than an area occupied by the first subpixel electrode 191a in the whole pixel electrode 191.

Each first/second subpixel electrode 191a/191b may be physically and electrically connected to the first/second drain electrode 175a/175b through contact hole 185a/185b, and may receive data voltages from the first/second drain electrode 175a/175b.

A lower alignment layer 11 may be formed on the pixel electrodes 191 and the connecting members 81 and 82.

A spacer 320 may be formed on the lower alignment layer 11. The spacer 320 may maintain a gap of the liquid crystal layer 3, and may be a column spacer 320. The column spacer 320 may be disposed between the first and second TFTs Qa and Qb. In some cases, the spacer 320 and the light blocking member 220 may be formed at different times. In some cases, the spacer 320 and the light blocking member 220 may be formed simultaneously. In the latter case, the light blocking member 220 and the column spacer 320 may be formed after formation of the pixel electrode 191. The light blocking member 220 and the column spacer 320 may include the same material and may be formed with different thicknesses from each other by using a half-tone mask. It should be understood that various suitable shapes, materials, and thicknesses of the column spacer 320 and light blocking member 220 may be used.

Next, a manufacturing method of the TFT array panel will be described with reference to FIG. 3, FIG. 4, and FIG. 5. A detailed description of like elements in FIG. 3 to FIG. 5 that have already been described is omitted.

The gate line 121 and the storage electrode line 131 and 135 may be formed on the substrate 110.

Next, the gate insulating layer 140 may be formed on the gate line 121 and the storage electrode line (131 and 135).

Next, the semiconductor 154 and the ohmic contacts 161a, 161b, 163a, 163b, 165a, and 165b may sequentially be deposited on the gate insulating layer 140, and subsequently patterned using photolithography.

The color filters 230B and 230G may be deposited on the ohmic contacts 161a, 161b, 163a, 163b, 165a, and 165b, and the gate insulating layer 140. Next, the color filters 230B and 230G may be patterned to form at least one opening exposing a portion of the ohmic contacts 161a, 161b, 163a, 163b, 165a, and 165b disposed on the portion overlapping the gate electrodes 124a and 124b. In some cases, if the color filters 230B and 230G include photosensitive organic material, the opening may be formed through the exposure and developing processes using a photolithography process.

Next, the data lines 171a and 171b and the drain electrodes 175a and 175b may be formed on the color filters 230B and 230G.

Next, the lower passivation layer 180p and the organic layer 180q may sequentially be deposited on the drain electrodes 175a and 175b, the data lines 171a and 171b, and the color filters 230B and 230G. The lower passivation layer 180p and the organic layer 180q may be patterned to form the contact holes 182, 185a, and 185b. In some cases, the contact holes 182, 185a, and 185b may be formed through photolithography. In other cases, the contact holes 182, 185a, and 185b may be formed using the exposure and developing processes if the lower passivation layer 180p and the organic layer 180q include the photosensitive organic material. The light blocking member 220 may be formed between the lower passivation layer 180p and the organic layer 180q.

Next, the pixel electrode 191 and the connecting members 81 and 82 may be formed on the organic layer 180q.

The lower alignment layer 11 may be formed on the pixel electrode 191 and the connecting members 81 and 82.

Next, the spacer 320 may be formed on the lower alignment layer 11. Alternatively, after forming the pixel electrode 191, the light blocking member 220 and the spacer 320 may be formed simultaneously.

Next, the liquid crystal layer 3 may be formed on the lower alignment layer 11.

Next, the common electrode 270 may be formed on the counter panel 200.

Next, the upper alignment layer (not shown) may be formed on the common electrode 270.

Next, the counter panel 200 may be aligned so that the common electrode 270 of the counter panel 200 may contact the liquid crystal layer 3, and that the TFT array panel 100 and the counter panel 200 may be combined.

However, if the liquid crystal layer 3 is formed on the common electrode 270 of the counter panel 200, the counter panel 200 may be aligned for the spacer 320 of the TFT array panel 100 to contact the liquid crystal layer 3. The TFT array panel 100 and the counter panel 200 may then be combined.

The method for forming the TFT and the electrode may generally be thin film deposition and patterning by photolithography.

Next, a TFT array panel according to another exemplary embodiment of the present invention will be described with reference to FIG. 6 and FIG. 7. A detailed description of like elements in FIG. 4 and FIG. 5 that have already been described above is omitted.

Figure 6:
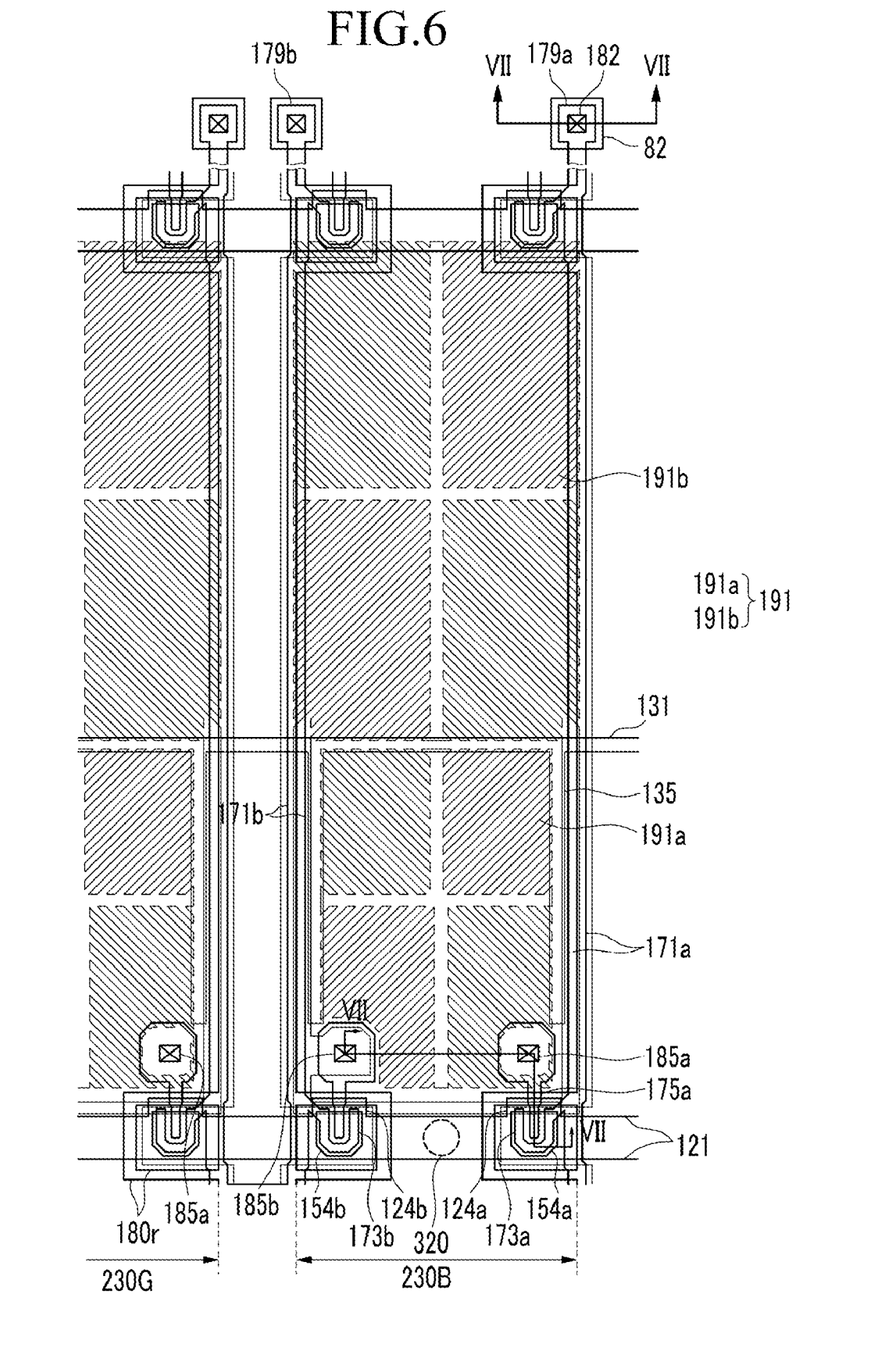
FIG. 6 is a layout view of a thin film transistor array panel according to an exemplary embodiment of the present invention.
Figure 7:
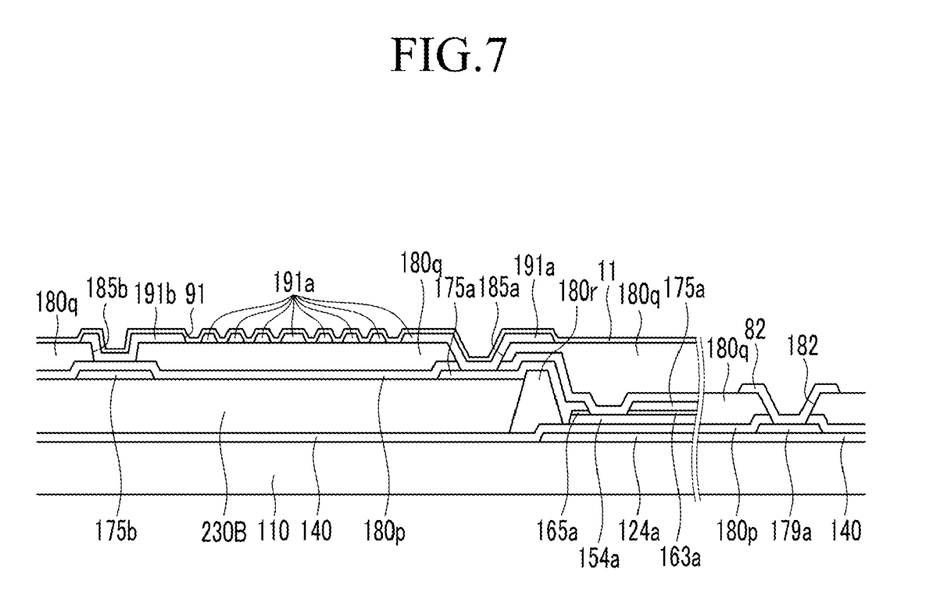
FIG. 7 is a cross-sectional view taken along the lines VII-VII of the thin film transistor array panel shown in FIG. 6.

FIG. 6 is a layout view of a TFT array panel according to an exemplary embodiment of the present invention, and FIG. 7 is a cross-sectional view of the TFT array panel shown in FIG. 6 taken along the line VII-VII.

A bank 180r may be formed on the ohmic contacts 161a, 161b, 163a, 163b, 165a, and 165b. The bank 180r may be made of organic material and may extend approximately parallel to the data lines 171a and 171b in the column (i.e., vertical) direction. The bank 180r may cover the data lines 171a and 171b and any portion therebetween. The bank 180r may also enclose the first and second TFTs Qa and Qb in a donut shape. Accordingly, the color filters 230B and 230G may be printed between two respective banks through an Inkjet process. Next, the data lines 171a and 171b and the drain electrodes 175a and 175b may be formed on the color filters 230B and 230G and the bank 180r such that deterioration of the TFT array panel may be prevented.

Next, a manufacturing method of the TFT array panel of FIG. 6 and FIG. 7 will be described. A detailed description of like elements in FIG. 6 and FIG. 7 that have already been described above is omitted A bank 180r may be formed after formation of the ohmic contacts 161a, 161b, 163a, 163b, 165a, and 165b. Next, the color filters 230B and 230G may be disposed through the inkjet process between two respective banks and then patterned to form the opening on the positions of the first and second TFTs Qa and Qb. Next, the data lines 171a and 171b and the drain electrodes 175a and 175b may be formed.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Thus, it is intended that the present invention cover the modifications and variations of this invention provided they come within the scope of the appended claims and their equivalents.

What is claimed is:

1. A thin film transistor array panel, comprising:
   a substrate;
   a gate line disposed on the substrate, the gate line comprising a gate electrode;
   a gate insulating layer disposed on the gate line;
   a semiconductor disposed on the gate insulating layer;
   a color filter disposed on the semiconductor;
   a data line disposed on the semiconductor, the data line comprising a source electrode; and
   a drain electrode comprising a first part and a second part,
   wherein the first part of the drain electrode is disposed on and overlaps the color filter and the second part of the drain electrode faces the source electrode.

2. The thin film transistor array panel of claim 1, wherein the semiconductor comprises a semiconductor pattern overlapping the gate electrode, and
   the color filter exposes at least a portion of the semiconductor pattern.

3. The thin film transistor array panel of claim 1, further comprising:
   an organic layer disposed on the drain electrode and the data line, the organic layer having an opening exposing a portion of the first part of the drain electrode.

4. The thin film transistor array panel of claim 3, wherein a difference between a first thickness of a first portion of the organic layer near the opening and a second thickness of a second portion of the organic layer near an end of the data line is 1 μm or less.

5. The thin film transistor array panel of claim 4, wherein the first thickness is substantially as thick as the second thickness.

6. The thin film transistor array panel of claim 4, wherein each of the first thickness and the second thickness is approximately 2-3 μm thick.

7. The thin film transistor array panel of claim 3, further comprising:
   a pixel electrode disposed on the organic layer, the pixel electrode being connected to a portion of the first part of the drain electrode through the opening.

8. The thin film transistor array panel of claim 7, further comprising:
   a spacer disposed on the gate line.

9. The thin film transistor array panel of claim 1, further comprising:
   a light blocking member disposed on the data line.

10. The thin film transistor array panel of claim 1, further comprising:
    a bank disposed between the semiconductor and the drain electrode.

11. The thin film transistor array panel of claim 10, wherein the semiconductor comprises a semiconductor pattern overlapping the gate electrode, and
    the color filter exposes at least a portion of the semiconductor pattern.

12. The thin film transistor array panel of claim 11, wherein the bank exposes the semiconductor pattern.

13. The thin film transistor array panel of claim 10, further comprising:
an organic layer disposed on the drain electrode and the data line, the organic layer comprising an opening exposing a portion of the first part of the drain electrode.

14. The thin film transistor array panel of claim 13, wherein a difference between a first thickness of a first portion of the organic layer near the opening and a second thickness of a second portion of the organic layer near an end of the data line is 1 μm or less.

15. The thin film transistor array panel of claim 10, wherein the bank contacts a boundary of the color filter.

* * * * *